United States Patent
Kuiper et al.

(10) Patent No.: US 10,866,431 B2
(45) Date of Patent: Dec. 15, 2020

(54) SELF HEALING LEAD WIRES IN HUMID ENVIRONMENTS

(71) Applicant: Verily Life Sciences LLC, Mountain View, CA (US)

(72) Inventors: Stein Kuiper, South San Francisco, CA (US); Daniel Otts, Pleasanton, CA (US)

(73) Assignee: Verily Life Sciences LLC, Mountain View, CA (US)

( * ) Notice: Subject to any disclaimer, the term of this patent is extended or adjusted under 35 U.S.C. 154(b) by 165 days.

(21) Appl. No.: 16/125,384

(22) Filed: Sep. 7, 2018

(65) Prior Publication Data

US 2019/0079317 A1 Mar. 14, 2019

Related U.S. Application Data

(60) Provisional application No. 62/556,082, filed on Sep. 8, 2017.

(51) Int. Cl.
*G02C 7/08* (2006.01)
*G02C 7/04* (2006.01)
(Continued)

(52) U.S. Cl.
CPC .............. *G02C 7/083* (2013.01); *G02C 7/041* (2013.01); *G02B 1/043* (2013.01); *H05K 1/09* (2013.01);
(Continued)

(58) Field of Classification Search
CPC ........ G02B 1/043; G02C 7/041; G02C 7/083; G02C 7/085; H05K 1/09;
(Continued)

(56) References Cited

U.S. PATENT DOCUMENTS 8,382,280 B2  2/2013  Gupta et al.
8,390,939 B2  3/2013  Henriksen et al.
(Continued)

FOREIGN PATENT DOCUMENTS

WO  2007107589 A1  9/2007
WO  2012166948 A1  12/2012
WO  2016182716 A1  11/2016

OTHER PUBLICATIONS

International Search Report of International Application No. PCT/US2018/050081 dated Nov. 7, 2018.
(Continued)

*Primary Examiner* — Cara E Rakowski
(74) *Attorney, Agent, or Firm* — McDonnell Boehnen Hulbert & Berghoff LLP

(57) ABSTRACT

A device is provided that may be operated when implanted within a body, when mounted to a surface of an eye, or when immersed in a fluid or otherwise exposed to a humid environment. The device includes at least one conductor that includes a valve metal. The valve metal is disposed on an external surface of the conductor such that, when the conductor exhibits a positive voltage relative to its environment, the valve metal forms or maintains a self-limiting oxide layer. The device is operated such that the mean voltage of the conductor is positive or zero relative to the environment, e.g., relative to another electrode or other conductor of the device that is in contact with fluid in the environment. Such a device can be operated for a protracted period of time in a humid environment without a hermetic seal disposed between the conductor and the humid environment.

20 Claims, 4 Drawing Sheets

(51) Int. Cl.
*H05K 1/09* (2006.01)
*G02B 1/04* (2006.01)
*H05K 1/18* (2006.01)

(52) U.S. Cl.
CPC ... *H05K 1/181* (2013.01); *H05K 2201/10037* (2013.01); *H05K 2201/10121* (2013.01); *H05K 2201/10151* (2013.01)

(58) Field of Classification Search
CPC ......... H05K 2201/10121; H05K 1/181; H05K 2201/10037; H05K 2201/10151
See application file for complete search history.

(56) References Cited

U.S. PATENT DOCUMENTS

| | | | |
|---|---|---|---|
| 8,460,376 | B2 | 6/2013 | Donitzky et al. |
| 8,513,324 | B2 | 8/2013 | Scales et al. |
| 8,665,526 | B2 | 3/2014 | Pugh et al. |
| 2007/0065295 | A1 | 3/2007 | Moraja et al. |
| 2008/0137213 | A1 | 6/2008 | Kuiper et al. |
| 2010/0312294 | A1 | 12/2010 | Martinez et al. |
| 2012/0200939 | A1* | 8/2012 | Kuiper .................. G02B 3/14 359/665 |
| 2013/0229618 | A1 | 9/2013 | Otts et al. |
| 2013/0258277 | A1 | 10/2013 | Pugh et al. |
| 2014/0253870 | A1 | 9/2014 | Jiang et al. |
| 2015/0043085 | A1 | 2/2015 | Tsuji |
| 2015/0077658 | A1 | 3/2015 | Pugh et al. |
| 2016/0058553 | A1 | 3/2016 | Salahieh et al. |
| 2016/0175805 | A1 | 6/2016 | Catchpole et al. |
| 2017/0176774 | A1* | 6/2017 | Linhardt .................. G02C 7/101 |

OTHER PUBLICATIONS

International Search Report and Written Opinion of International Application No. PCT/US2018/017097 dated May 15, 2018.

Mugele et al., "Electrowetting: from basics to applications", Topical Review, Journal of Physics: Condensed Matter, Published Jul. 1, 2005.

B. Berge, "Liquid Lens Technology: Principle of Electrowetting Based Lenses and Applications to Imaging", IEEE, 2005, pp. 227-230.

Lu et al., "Tunable dielectric liquid lens on flexible substrate", Applied Physics Letters 103, 2013.

Mallin, "Flexible Membrane Liquid Lens", Optics & Optoelectronics, 2011 NNIN REU Research Accomplishments.

Li et al., "Fabrication and Characterization of Flexible Electrowettingon Dielectrics (EWOD) Microlens", NIH Author Manuscript, 2014, 432-441.

Li et al., "Electrowetting-driven variable-foxus microlens on flexible surfaces", Applied Physics Letters 100, 2012.

Wikipedia, Cathodic protection, https://en.wikipedia.org/wiki/Cathodic_protection.

Geddes et al., "Criteria for the Selection of Materials for Implanted Electrodes", Annals of Biomedical Engineering, vol. 31, pp. 879-890, 2003.

Dhindsa et al., "Electrowetting without Electrolysis on Self-Healing Dielectrics", Langmuir 2011, 27, 5665-5670.

\* cited by examiner

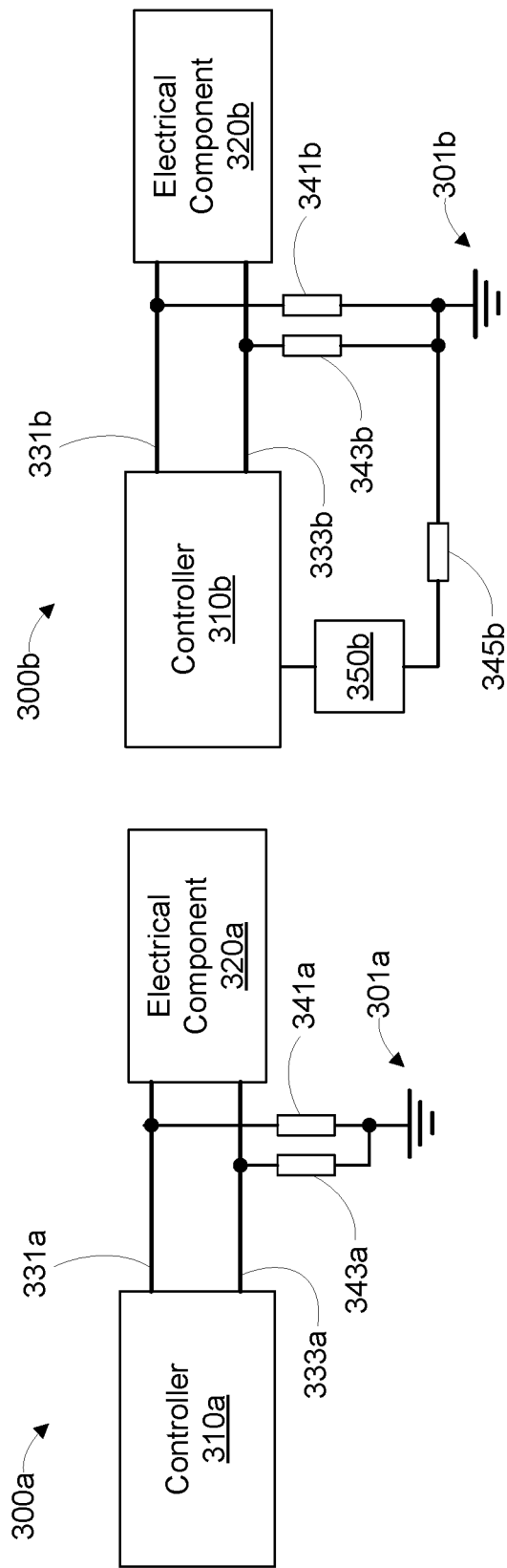

SELF HEALING LEAD WIRES IN HUMID ENVIRONMENTS

CROSS-REFERENCE TO RELATED APPLICATION

This application claims priority to U.S. Provisional Patent Application No. 62/556,082, filed Sep. 8, 2017, which is incorporated herein by reference.

BACKGROUND

Unless otherwise indicated herein, the materials described in this section are not prior art to the claims in this application and are not admitted to be prior art by inclusion in this section.

A variety of devices exist that are designed to work in humid environments, e.g., when implanted into a body, when contact-mounted to an eye, when submerged in a fluid. Such a device may include casings, sealants, coatings, or other features to prevent ingress of moisture (e.g., water, water vapor) into an interior volume of the device and/or to prevent wires, traces, electrodes, batteries, electronics, or other components of the device from interacting with moisture. However, in examples wherein such sealants, casings, or other features fail (e.g., by aging, by cracking, by experiencing damage), moisture may enter such a device and cause deleterious effects on the structure and/or function of the device. For example, conductors of the device (e.g., wires, conductive traces) may exhibit oxidation. In order to prevent this from occurring, additional features may be added to the device (e.g., a thicker layer of a sealant). However, such additions may increase the volume or cost of the device or have other unwanted effects.

SUMMARY

Some embodiments of the present disclosure provide a device that is immersible in a body fluid. The device includes: (i) a first conductor, wherein an external surface of the first conductor includes a valve metal; (ii) a second conductor; (iii) an electrical component; and (iv) a controller. The controller is electrically coupled to the electrical component via the first conductor and the second conductor. The controller is operable to apply a voltage between the first conductor and the second conductor such that the first conductor has a positive voltage relative to the second conductor.

Some embodiments of the present disclosure provide another device that is immersible in a body fluid. The device includes: (i) a first conductor, wherein an external surface of the first conductor includes a valve metal; (ii) a second conductor, wherein an external surface of the first conductor includes a valve metal; (iii) an electrical component; and (iv) a controller. The controller is electrically coupled to the electrical component via the first conductor and the second conductor. The controller is operable to: (a) apply, during a first period of time, a voltage between the first conductor and the second conductor such that the first conductor has a positive voltage relative to the second conductor; and (b) apply, during a second period of time, a voltage between the first conductor and the second conductor such that the first conductor has a negative voltage relative to the second conductor.

Some embodiments of the present disclosure provide yet another device that is immersible in a body fluid. The device includes: (i) a first conductor, wherein an external surface of the first conductor includes a valve metal; (ii) a second conductor; (iii) a battery; and (iv) an electrical component. The electrical component is electrically coupled to the battery via the first conductor and the second conductor. The battery provides a voltage between the first conductor and the second conductor such that the first conductor has a positive voltage relative to the second conductor These as well as other aspects, advantages, and alternatives, will become apparent to those of ordinary skill in the art by reading the following detailed description, with reference where appropriate to the accompanying drawings.

BRIEF DESCRIPTION OF THE DRAWINGS

FIG. 3A is an example equivalent electronic circuit of elements of an example device.

FIG. 3B is an example equivalent electronic circuit of elements of an example device.

DETAILED DESCRIPTION

Figure 1A:
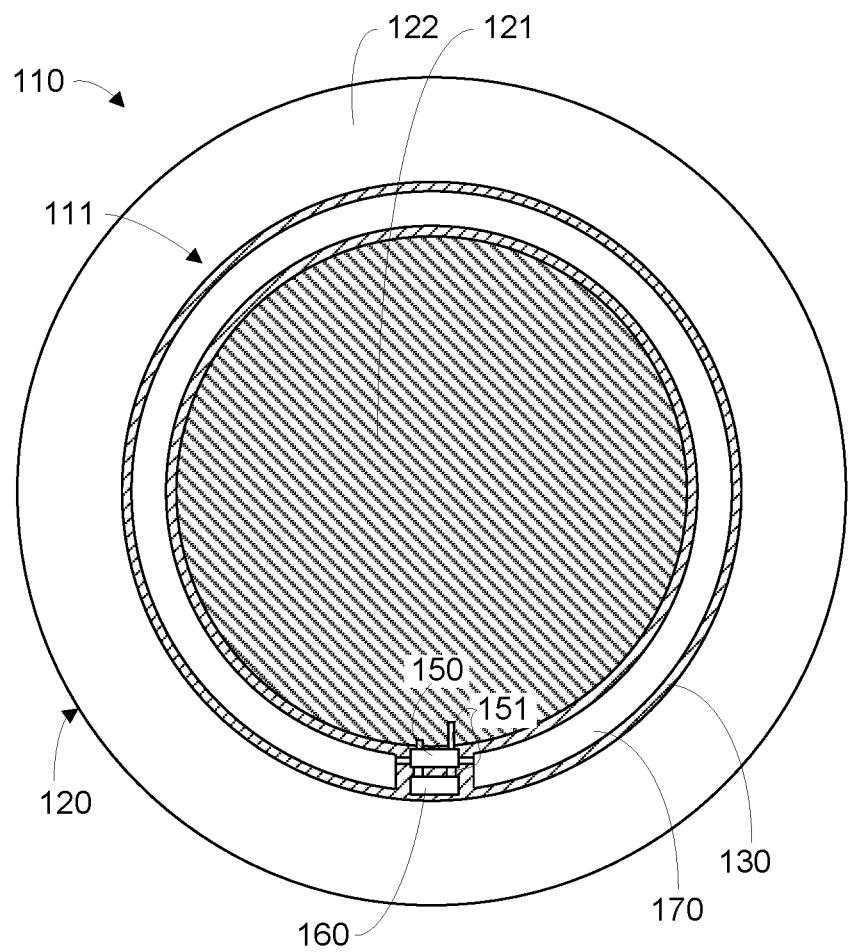
FIG. 1A is a top view of an example eye-mountable device.

In the following detailed description, reference is made to the accompanying figures, which form a part hereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

I. Overview

A variety of applications may include devices operating in submerged, implanted, or otherwise humid environments. For example, pacemakers, cochlear implants, or other implanted devices may be exposed to extracellular fluid, blood, endolymph, perilymph, or other fluids. In other examples, contact lenses, ingestible cameras, or other ingestible or body-mountable devices configured to operate while in contact with, partially submerged in, and/or fully submerged in tear fluid, chyme, saliva, mucous, or other body fluids. Fluids could enter such a device from the environment and degrade or disable the operation of the device, e.g., by entry through cracks or other entry points through a housing of the device, by diffusion as water vapor through a vapor-permeable seal or other material of the device, or by some other method. Once inside the device, the water or other fluid could create electrical shorts between conductors of the device, could cause corrosion of metallic elements (e.g., wires, conductive traces) of the device, or could cause other unwanted effects on the device.

To prevent ingress of water or other fluid into such a device, the device could include seals, housings, coatings, or other means for preventing exposure of internal elements (e.g., electronics, conductors, metallic elements) to the fluid. However, such a solution may be expensive, may increase the size of the device, may reduce the flexibility of the device, may reduce a transparency of the device, may introduce difficulties in passing electrical or other signals into or out of the device, or may present other unwanted conditions on the manufacture, operation, or cost of the device. Further, such measures could fail, leading to ingress of water or other fluids into the device. For example, repeated flexure or prolonged exposure to a humid environment could result in the development of cracks or other means for fluid ingress through a seal or housing of such a device.

In order to reduce the necessity of such housings, seals, or other means for providing water-resistance, to increase the flexibility of a device, to decrease the size of a device, to relax one or more material specifications of a device, or to provide some other benefit, internal components of the device could be configured and/or operated such that exposure to a fluid (e.g., due to intentional exposure to water and/or due to the complete or partial failure of a seal or other water-resistant feature of the device) does not significantly hinder the operation or structural or electrical integrity of elements of the device. This can include forming one or more conductive traces or other conductive elements of the device from valve metals, or alloys of valve metals, such that the one or more conductive traces form a self-limiting protective oxide layer when exposed to water or other fluids while a non-negative bias is applied to the conductive elements relative to such fluids. Such conductive elements could be formed completely from such valve metals and/or could have an outer layer formed from a valve metal while an interior volume of the conductor is formed from a non-valve metal (e.g., copper).

Valve metals and/or alloys composed of valve metals are those metals that, when exposed to water or some other aqueous fluid and maintained at a voltage that is greater than a threshold voltage, relative to the water or other aqueous fluid, develop a self-limiting oxide layer at a surface of the metal that is in contact with the water or other fluid. Valve metals include aluminum, titanium, tungsten, tantalum, vanadium, zirconium, niobium, hafnium, and molybdenum. Valve metal alloys can include alloys of valve metals and/or other materials, e.g., an alloy composed of titanium, vanadium, and aluminum. A thickness of an oxide layer formed on a surface of such a valve metal conductor could be a function of the voltage of the conductor relative to water or other conducting fluids to which the conductor is exposed. In some examples, the oxide layer could be pre-formed (e.g., via anodization). Alternatively, the oxide layer could form due to exposure to a body fluid or other humid environment.

The protective, self-limiting oxide layer of such a valve metal conductor could be maintained via a variety of methods or means. In some examples, an average voltage level of the valve metal conductor could be maintained at a sufficiently positive value relative to fluid in an environment of the valve metal in order to maintain the thickness of such an oxide layer greater than a specified thickness. For example, the valve metal could be maintained at a non-negative voltage relative to an electrode (e.g., a noble-metal electrode) that is in electrical contact with the environmental fluid. Additionally or alternatively, an alternating voltage could be applied between two or more valve metal conductors such that damage to the oxide layer of a first one of the valve metal conductors may be repaired without substantially degrading the oxide layer of the one or more other valve metal conductors.

II. Example Device

A variety of devices are designed to operate while submerged within or otherwise exposed to water or other fluids. Such devices include implantable devices like pacemakers, insulin pumps, cochlear implants, deep brain stimulators, retinal prostheses, electronic intraocular lenses, or other implanted devices. Such devices also include body-mountable, ingestible, or otherwise-configured devices that are designed to operate in contact with tear fluid, saliva, mucous, sweat, or other fluids present on the outside of the body and/or within externally-accessible cavities of the body. Such body-mountable, ingestible, or otherwise-configured devices include electronic contact lenses, ingestible cameras, drug delivery devices, or other devices.

Such devices could include housings, sealants, conformal coatings, or other means for preventing exposure of internal components of such devices (e.g., electronics, batteries, conductors) to water or other fluids from the human body (or from some other environment of interest). Such water-resisting means may be susceptible to damage (e.g., due to repeated flexing and/or exposure to degrading chemicals, UV radiation, electric fields, or other factors) and/or may permit a certain baseline degree of ingress of water or other fluids.

In order to reduce the requirements for such water-resisting means (e.g., to permit a device to be smaller, to be more flexible, to permit transmission of light through the device, to reduce a cost of the device), to obviate the need for such water-resisting means, to improve to lifetime of operation of such devices, and/or to provide some other benefit, a device could be configured and/or operated as described herein. That is, one or more conductors of the device could include a valve metal such that, during the operation of the device, the conductor forms and/or maintains a self-limiting protective oxide layer between the conductor and any sources of water or other aqueous fluids. For example, a layer of titanium oxide on the surface of a titanium conductor or a layer of aluminum oxide on the surface of an aluminum conductor. Such a conductor could, when exposed to water or some other fluid, develop such an oxide layer until the oxide layer is limited, e.g., by a magnitude of a positive voltage difference between the conductor and the water. In the event that such an oxide layer is damaged (e.g., due to flexion of the conductor, due to the conductor being scratched by an object), the oxide layer could be re-formed at the location of the damage.

Such conductors could be provided to facilitate electrical coupling between elements of a device. By using such a valve metal conductor, an amount or presence of protective material (e.g., of water-resistant material) between the coupled elements could be reduced. For example, such a conductor could be provided to facilitate electrical contact between a microcontroller disposed within a water-resistant housing and a battery that provides power to the microcontroller; such a battery may also be disposed within the water-resistant housing. Additionally or alternatively, an electrode, an antenna, or some other conductive element of a device could be composed of the valve metal, such that an amount or presence of a water-resistant coating on or around the conductive element could be reduced. For example, an electrode of an electrowetting, liquid crystal, or otherwise-configured electronically adjustable lens could be composed of such a valve metal. In such an example, the adjustable lens could be made permeable to water or some other fluid (e.g., by manufacture, or due to damage or protracted use) without significantly reducing the functionality of the electronic lens (e.g., due to corrosion of the electrode).

A valve metal-containing conductor as described herein could be incorporated into an eye-mountable or eye-implantable device. Such an eye-mountable device could additionally include an electronic apparatus (e.g., one or more sensors, controllers, batteries, antennas, adjustable lenses, or other elements) that, along with the valve metal conductor, is encapsulated within a rigid, gas permeable polymer layer, a soft polymer layer, or within some other encapsulating material. Such encapsulation could provide protection and/or structure to the electronic apparatus, an overall shape or external mounting surface of the eye-mountable device, and/or some other benefit. An eye-mountable or eye-implantable device including an adjustable lens can be configured or operated to provide a controllable optical power to an eye and/or some other applications (e.g., sensing a level of blood oxygenation or other physiological parameters of a wearer, detecting blinks or other user inputs or actions, providing power to a device implanted within an eye).

Figure 1B:
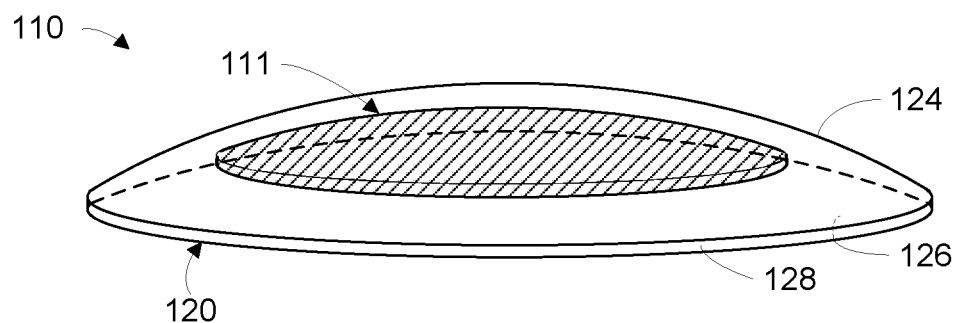
FIG. 1B is an aspect view of the example eye-mountable device shown in FIG. 1A.

FIG. 1A is a top view of an example eye-mountable device 110. FIG. 1B is an aspect view of the example eye-mountable device shown in FIG. 1A. It is noted that relative dimensions in FIGS. 1A and 1B are not necessarily to scale, but have been rendered for purposes of explanation only in describing the arrangement of the example eye-mountable device 110. The eye-mountable device 110 includes an electronic apparatus 111 embedded within a polymer layer 120. The electronic apparatus 111 includes an adjustable lens 121. Components of the electronic apparatus 111 may be embedded in (e.g., fully encapsulated within) a rigid, gas-permeable polymer layer, a soft polymer layer, or other material to provide mechanical stability to the electronic apparatus 111, to prevent exposure of components of the electronic apparatus 111 to water or other substances in an environment of the eye-mountable device 110, or to provide some other benefit. The polymer layer 120 could comprise such a rigid, gas-permeable polymer layer or other material; alternatively, such a rigid, gas-permeable polymer layer could be embedded within the polymer layer 120 (e.g., within a soft hydrogel of the polymer layer 120).

The polymer layer 120 can be shaped as a curved disk. The polymer layer 120, elements of the electronic apparatus 111 (e.g., lenses, lens chambers, electrodes, liquid crystals, immiscible fluids), or other components of the eye-mountable device 110 can be composed of substantially transparent material(s) to allow incident light to be transmitted to the eye while the eye-mountable device 110 is mounted to the eye. The polymer layer 120 can be a biocompatible, oxygen-permeable material similar to those employed to form soft vision correction and/or cosmetic contact lenses in optometry, such as a silicone hydrogel. Additionally or alternatively, a rigid, gas-permeable polymer layer encapsulating the electronic apparatus 111 and/or one or more lenses or other elements of the adjustable lens 121 could be composed of a biocompatible, oxygen-permeable material like silicone acrylate, fluoro-silicone acrylate, or some other rigid, gas-permeable polymers. The polymer layer 120 and/or one or more lenses or other elements of the adjustable lens 121 could include further compounds or materials to provide some functionality, e.g., to block ultraviolet light from being transmitted, through the eye-mountable device 110, to an eye. Further, the polymer layer 120 could include a surface coating configured to provide some functionality, e.g., a hydrophilic coating or some other coating to increase wetting and/or comfort.

The polymer layer 120 can be formed with one side having a concave surface 126 suitable to fit over a corneal surface of an eye. The opposing side of the disk can have a convex surface 124 that does not interfere with eyelid motion when the eye-mountable device 110 is mounted to the eye. A circular outer side edge 128 connects the concave surface 124 and convex surface 126. The eye-mountable device 110 can have dimensions similar to a vision correction and/or cosmetic contact lenses, such as a diameter of approximately 1 centimeter, and a thickness of about 0.1 to about 0.5 millimeters. However, the diameter and thickness values are provided for explanatory purposes only. In some embodiments, the dimensions of the eye-mountable device 110 can be selected according to the size and/or shape of the corneal surface of the wearer's eye. The shape of the eye-mountable device 110 can be specified with a curvature, astigmatism, or other properties to provide a specified optical power to an eye. Additionally or alternatively, the shape of the eye-mountable device 110 could be specified to apply a force to a cornea of an eye to which the eye-mountable device 110 is mounted, e.g., to correct keratoconus or according to some other application.

The polymer layer 120 can be formed with a curved shape in a variety of ways. For example, techniques similar to those employed to form vision-correction contact lenses can be employed to form the soft polymer layer 120. These methods can include molding, machining, lathing, polishing, or other processes. While the eye-mountable device 110 is mounted in an eye, the convex surface 124 faces outward to the ambient environment while the concave surface 126 faces inward, toward the corneal surface. The convex surface 124 can therefore be considered an outer, top surface of the eye-mountable device 110 whereas the concave surface 126 can be considered an inner, bottom surface. The "top" view shown in FIG. 1A is facing the convex surface 124. From the top view shown in FIG. 1A, the outer periphery 122, near the outer circumference of the curved disk is curved into the page, whereas the center region, corresponding to the location of the electroactive lens 121, near the center of the disk is curved out of the page.

An electronic apparatus 111 is embedded within the polymer layer 120. The electronic apparatus 111 includes the central adjustable lens 121 surrounded by a substrate 130. The adjustable lens 121 and substrate 130 can be embedded such that the substrate 130 is situated along the outer periphery of the polymer layer 120, away from the center region of the eye-mountable device 110. The substrate 130 does not interfere with vision because it is too close to the eye to be in focus and is positioned away from the center region of the adjustable lens 121 where incident light is transmitted, through the adjustable lens 121, to the light-sensing portions of the eye. Moreover, the substrate 130 can be formed of a transparent material to further mitigate any effects on visual perception. In some examples, the substrate 130 could be formed from and/or disposed on an element of the adjustable lens 121. For example, a particular lens or other element of the adjustable lens 121 could include a peripheral region on which electronics can be disposed and/or on which metallic traces, electrodes, antennas, interconnects, or other conductive elements (e.g., conductive elements for electrically coupling electronics to electrodes or other elements of the adjustable lens 121) can be formed.

The substrate 130 can be shaped as a flat, circular ring (e.g., a disk with a central hole). The flat surface of the substrate 130 (e.g., along the radial width) is a platform for mounting electronics such as chips (e.g., via flip-chip mounting) and for patterning conductive materials (e.g., via deposition techniques) to form electrodes (e.g., an anode and/or cathode of an electrochemical battery, electrodes for detecting an impedance of a tear film or other tissues, electrodes of an electrochemical sensor, contact electrodes for electrically contacting with leads of the adjustable lens 121, conductors for providing electrical connections between such components), conductive loops (e.g., a conductive loop of an eyelid occlusion sensor, an electrode of a loop-shaped battery), antenna(e), and/or connections. The substrate 130, adjustable lens 121, and/or the polymer layer 120 can be approximately cylindrically symmetric about a common central axis. The substrate 130 can be implemented in a variety of different form factors.

A conductive loop 170, controller 150, and sensor 160 are also disposed on the embedded substrate 130. The controller 150 can be a chip including logic elements configured to detect an occlusion of the eye-mountable device using the conductive loop 170 and/or sensor 160, to receive wireless power using the conductive loop 170, to be powered by a battery that includes the conductive loop 170 as an electrode, to send and/or receive wireless communications using the conductive loop 170, to operate the sensor 160, to provide a controllable optical power using the adjustable lens 121, and/or to provide some other operability to the device 110.

The controller 150 is electrically connected to the conductive loop 170, sensor 160, and adjustable lens 121 (e.g., to conductive leads or electrodes of the adjustable lens 121) by interconnects 151 that may be wholly or partially situated on the substrate 130. Such interconnects 151 may be wholly or partially composed of valve metals and operated as described herein in order to prevent degradation of such interconnects (e.g., by reducing an amount or degree of oxidation of the interconnects, when exposed to water or other fluids, relative to other materials and/or methods of operation). Additional or alternative components could be disposed on the substrate 130, e.g., an electrochemical battery could be provided on the substrate 130 to power the eye-mountable device 110. In some examples, the conductive loop 170 may form an electrode (e.g., a cathode) of such a battery.

Figure 1C:
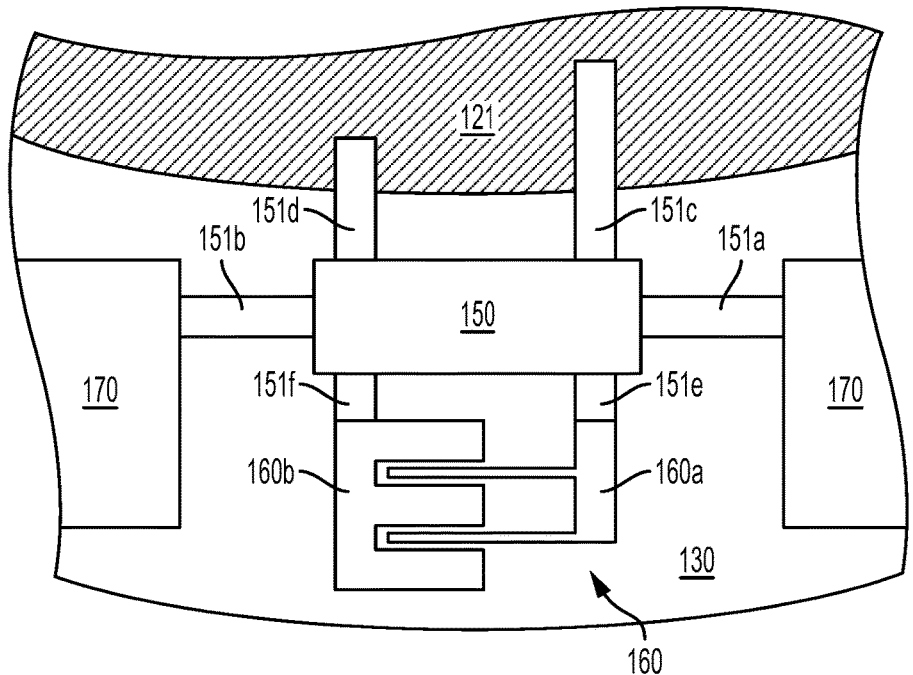
FIG. 1C is a top view of elements of the example eye-mountable device shown in FIG. 1A.
Figure 1D:
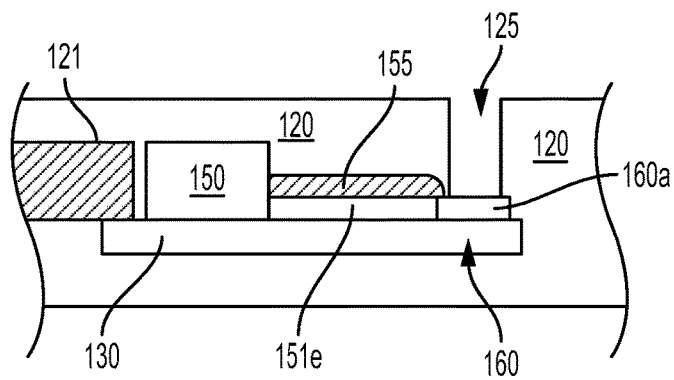
FIG. 1D is a side cross-section view of the elements of the example eye-mountable device shown in FIG. 1C.

FIG. 1C illustrates a portion of the top of the example eye-mountable device 110. FIG. 1C shows the controller 150, first 160a and second 160b electrodes of the sensor 160, portions of the conductive loop 170, a portion of the adjustable lens 121, and interconnects 151a, 151b, 151c, 151d, 151e, 151f that are disposed on the substrate 130 and that provide electrical connections between the controller 150 and the other components of the device 110. FIG. 1D shows a cross-sectional view of the elements of the device 110 that are shown in FIG. 1C. FIG. 1D illustrates the interconnect 151e that provides an electrical connection between the controller 150 and the first electrode 160a of the sensor 160. A protective barrier layer 155 is disposed on the interconnect 151e. A window 125 is formed through the polymer layer 120 to expose the first electrode 160a to the environment of the device 110 (e.g., to expose the first electrode 160a to tear fluid of an eye to which the device 110 is mounted).

The interconnects 151a-f conductive loop 170, and any conductive electrodes (e.g., 160a and 160b of the sensor 160, an anode and cathode of an electrochemical battery, electrodes of an impedance sensor configured to detect an impedance through a tear film or other tissues, for an electrochemical ion sensor, etc.) may be formed from conductive materials patterned on the substrate 130 by a process for precisely patterning such materials, such as deposition, lithography, etc. In embodiments wherein the substrate 130 is part of a lens or other element(s) of the adjustable lens 121, electrode(s) of the adjustable lens 121 could be formed on the lens or other element(s) of the adjustable lens 121 via such processes.

The conductive materials patterned on the substrate 130 can be, for example, gold, platinum, palladium, titanium, carbon, aluminum, copper, silver, silver-chloride, conductors formed from noble materials, valve metals, combinations of these, etc. Electrode(s) of the adjustable lens 121, sensor 160, or other components of the device 110 could be electrically coupled to the controller 150 or other electronic components of the eye-mountable device 110 via such interconnects 151a-f and/or via wires, conductive adhesives, liquid crystal, or some other interconnecting means.

Some or all of the conductors (e.g., interconnects 151a-f, antennas, electrodes) of the device 110 may be composed of valve metals to provide the benefits described herein. Valve metals are metals that, when maintained at a non-negative voltage relative to certain fluids in contact therewith (e.g., water, tear fluid, other aqueous fluids, glycols, or other conducting fluids), can form a self-limiting protective oxide layer. Such a self-limiting oxide layer may prevent portions of the conductor that are protected by the layer from oxidizing when the conductor is exposed to water or other fluids. The presence and/or growth to such a protective, self-limiting oxide layer on such a conductor may prevent the conductor from failing electrically (e.g., by exhibiting a prohibitively high impedance relative to an application of the conductor) and/or mechanically (e.g., by cracking) due to exposure to such fluids. Valve metals include aluminum, tungsten, titanium, vanadium, tantalum, zirconium, niobium, hafnium, and molybdenum. A valve metal may include alloys of such metals and/or of other materials. For example, a valve metal may include an alloy of titanium, vanadium, and aluminum.

A conductor of the device 110 may be composed entirely of a valve metal (e.g., one or more of the conductors 151a-f may be formed by depositing an amount of aluminum, titanium, or some other valve metal). Additionally or alternatively, a conductor of the device 110 may be formed by disposing a valve metal as an external layer or coating on some other conductive material (e.g., a layer of aluminum deposited via chemical vapor deposition, voltammetry, or some other method on copper or some other material). In yet another example, conductive elements of the device 110 could be formed by depositing conductive materials, sensitizing agents or other substances onto a valve metal. For example, the interconnect 151e and the first electrode 160a could be formed by depositing an amount of valve metal (e.g., aluminum) on the substrate 130 to form the shape of the interconnect 151e and the first electrode 160a. Gold, silver, silver chloride, an amount of an enzyme or other chemical sensitizing agent, and/or some other material(s) could then be disposed on the surface of the valve metal (e.g., via chemical vapor deposition, via electrodeposition) to form the first electrode 160a.

To maintain and/or grow a self-limiting oxide layer on such a conductor, a positive voltage could be applied to the conductor relative to water or other fluid (e.g., a tear fluid, interstitial fluid) that is in contact with the valve metal surface of the conductor. For example, the controller 150 could apply a positive voltage to the valve metal conductor relative to some other conductor of the device 110 (e.g., a conductor in contact with the tear fluid or other fluid in the environment of the device 110). In another example, the valve metal conductor could be electrically connected to and/or part of a battery that continuously applies such a positive voltage to the valve metal conductor.

The presence of such a positive voltage, relative to the fluid or to some other electrode or other conductor that is in contact with the fluid, could result in oxidation of valve metal that is on the surface of the conductor and that is exposed to the fluid (e.g., due to a crack, scratch, or other damage to the conductor). The exposed portion of valve metal could develop an oxide layer (e.g., via redox reactions with water or other substances in the fluid) that is continuous with the existing oxide layer of the conductor. The oxide layer could develop until it self-limits (e.g., until the thickness of the oxide layer reaches a thickness limited by the relative voltage applied to the conductor).

Figure 2A:
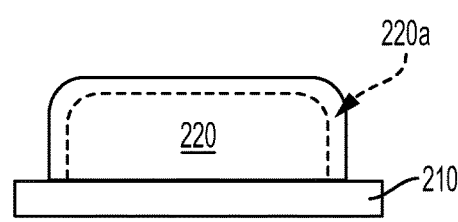
FIG. 2A is a side cross-section view of elements of an example device.
Figure 2B:
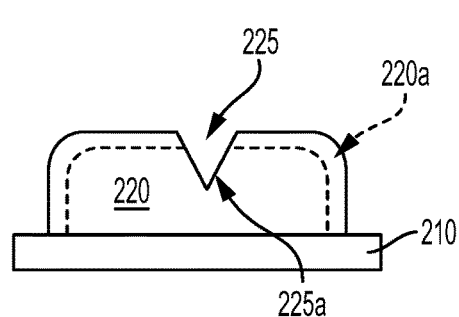
FIG. 2B is a side cross-section view of the elements of the example device shown in FIG. 2A.
Figure 2C:
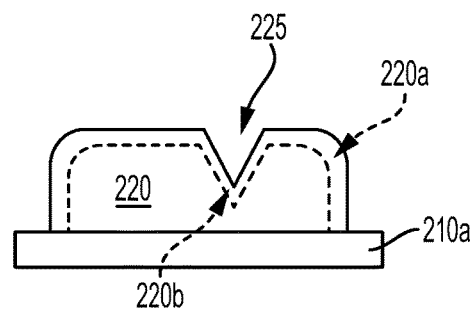
FIG. 2C is a side cross-section view of the elements of the example device shown in FIG. 2A.

Such a process is illustrated in FIGS. 2A-C. FIG. 2A shows a conductor 220 disposed on a substrate 210. The conductor 220 is composed of a valve metal and includes an oxide layer 220a at the exposed surface of the conductor 220a (i.e., the surfaces of the conductor not in contact with, and thus shielded by, the substrate 210). The oxide layer 220a comprises oxides of the valve metal and may be formed from and/or continuous with the non-oxidized valve metal of the conductor 220. For example, the oxide layer 220a may have been formed via a process of anodization from underlying non-oxidized valve metal. Additionally or alternatively, the oxide layer 220a may be formed via chemical vapor deposition, sputtering, or some other process. The conductor 220 could be composed entirely of the valve metal and oxides thereof (e.g., the conductor 220 could be composed entirely of aluminum and an oxide layer 220a of aluminum oxide) or could include a surface layer of the valve metal disposed on an underlying bulk of some other material (e.g., copper).

The conductor 220 could be an interconnect, an electrode (e.g., of an electrochemical sensor, of a fluid impedance sensor, of an electrochemical battery), a wire, an antenna, an electrode of a button, an electrode of an electrowetting adjustable lens or other electrowetting device, an electrode of a liquid crystal adjustable lens or some other liquid crystal device, or some other conductive element of a device or system. For example, the conductor 220 could represent one or more of the interconnects 151a-f, the electrodes 160a, 160b, the loop conductor 170, an electrode or other element of the adjustable lens 121, or some other component of the eye-mountable device 110.

FIG. 2B shows the conductor 220 after the conductor has been damaged. The damage could be the result of flexure or deformation of the conductor 220, contact with a damaging object (e.g., puncture, scraping, impact, crushing, or other damage), exposure to heat or other energy (e.g., sufficient energy to melt, boil, thermally stress, or otherwise damage the conductor 220), or some other source of damage. As a result of the damage, a hole 225 has been formed through the oxide layer 220a, exposing an amount of the underlying valve metal at an exposed surface 225a. Current could flow between the conductor 220 and the environment of the conductor 220 (e.g., a fluid in which the conductor 220 is submerged or otherwise in contact with) via the exposed surface 225a of the valve metal underlying the oxide layer 220a. Such a current could cause unwanted effects on the operation of a device or system that includes the conductor 220 (e.g., by providing an electrical short between the conductor 220 and some other element). Other deleterious effects could result from the underlying valve metal being exposed (e.g., chemical reactions between the valve metal and the environment).

Under certain conditions, additional valve meal oxide could be developed on such an exposed amount of valve metal to protect the underlying valve metal and to prevent further oxidation of the underlying valve metal. For example, the exposed surface 225a of the valve metal could be in contact with water or other some other aqueous fluid and the conductor 220 could be maintained at a positive voltage relative to the fluid. In such an example, an additional amount of valve metal oxide could be grown (e.g., via redox reactions between the valve metal and substances in the water or other fluid). This is illustrated in FIG. 2C, which shows the conductor 220 having grown an additional oxide layer 220b at the surface which was previously exposed (e.g., exposed surface 225a shown in FIG. 2B). The growth of this additional oxide 220b has resulted in no portion of the underlying valve metal of the conductor 220 being directly exposed to the environment of the conductor 220.

The formation of the additional oxide 220b is related to the conductor 220 being at a positive voltage relative to the water or other fluid with which the conductor 220 is in contact. The positive voltage results in a current flowing through the exposed surface 225a into the fluid. This current flow results in redox reactions at the exposed surface 225a which can include oxidation of valve metal at the exposed surface 225a to form the additional oxide layer 220b. The thickness of the formed, self-limiting additional oxide layer 220b may be related to the magnitude of the applied positive voltage and to the composition of the fluid in contact with the exposed valve metal. For example, if the valve metal at the exposed surface is aluminum and the fluid is de-ionized water, the self-limiting oxide layer formed could have a thickness of approximately 1.4 nanometers per volt of positive potential difference between the conductor 220 and the de-ionized water.

Such a positive voltage could be applied (e.g., by the controller 150) to one or more of the interconnects 151a-f) substantially continuously to the valve metal conductor. This could include maintaining the valve metal conductor at a non-negative voltage relative to another conductor (e.g., a gold or gold-plated electrode) that is in electrical contact with water or other fluid in the environment of the valve metal conductor. For example, a positive electrode of the adjustable lens 121 (e.g., a positive electrode of an electrowetting lens), of an electrochemical sensor (e.g., one of the electrodes of the sensor 160) and/or a conductor electrically connected thereto (e.g., 151c, 151e), or some other electrode or related conductor(s) could be composed of such a valve metal. In another example, a positive electrode of an electrochemical battery and/or a conductor electrically connected thereto could be composed of such a valve metal. In some examples, two or more conductors that provide an electrical connection to an electrical component (e.g., a controller, an adjustable lens, a sensor, or some other electrical component) could be composed of a valve metal. For example, the interconnects 151a, 151b connected to the conductive loop 170, as well as all or part of the conductive loop 170 itself, could be composed of a valve metal.

If a negative voltage is applied to a valve metal conductor, relative to an environmental fluid with which the conductor is in contact, an amount of valve metal and/or valve metal oxide on the surface of the conductor may be reduced. This could result in a reduction in the thickness of an insulating, protective valve metal oxide layer on the surface of the conductor. In some examples, a device or system that includes valve metal conductors as described herein may periodically apply such negative voltages to the valve metal conductors. Such devices or systems may operate to prevent extensive reduction of the valve metal oxide layer of such conductors by applying, during one or more periods of time, positive voltages to such valve metal conductors in order to re-grow the oxide layer.

For example, two valve metal conductors could connect a controller to electrodes of an adjustable lens or to some other electrical component. Both valve metal conductors could include pre-formed (e.g., via anodization), insulating valve metal oxide layers disposed on the surfaces of the conductors in contact with a fluid (e.g., water) that is in the environment of the conductors. Positive and negative voltages may be applied between the conductors (e.g., to control an optical power of the adjustable lens by manipulating droplets of fluid within the lens via electrowetting). During normal operation, the intact oxide layers can prevent substantial current flows between the conductors and the fluid. In the event that the oxide layer of a first one of the conductors is damaged (e.g., by cracking due to bending or other deformation of the conductor), an underlying amount of non-oxidized valve metal of the first conductor could be exposed to the fluid.

When a positive voltage is applied to the first conductor, relative to the second valve metal conductor, a current could flow through the exposed valve metal of the first conductor into the fluid to form an additional amount of valve metal oxide on the exposed valve metal of the first conductor. An opposite current could flow through the oxide layer of the second conductor into the fluid, reducing an amount of the oxide layer of the second conductor without exposing the underlying non-oxidized valve metal of the second conductor. As the thickness of the newly formed oxide layer increases, the currents through the first and second conductors into the fluid may also decrease.

Certain substances may interfere with the formation of a self-limiting oxide layer on a valve metal conductor as described herein. For example, when aluminum is in contact with an aqueous solution that includes certain negative ions such as chloride, iodide, bromide, fluoride, or other halides, the aluminum oxide layer formed by application of a positive voltage to the aluminum may be porous and non-self-limiting. A device or system as described herein may include protective layers, barriers, getters, catalysts, chemicals, or other substances or features to facilitate the formation of self-limiting oxide layers on valve metal conductors as described herein.

As an illustrative example embodiment, the eye-mountable device 110 includes a barrier layer 155 disposed on a surface of the interconnect 151e that is connected to the first electrode 160a. The barrier layer 155 could be configured to impede and/or substantially prevent certain substances from the environment of the device 110 from interacting with the interconnect 151e, could adjust a pH or other property of fluids from the environment that come into contact with the interconnect 151e, or could be otherwise configured to control one or more characteristics of the environment of the interconnect 151e such that, when a positive voltage is applied to the interconnect 151e relative to a fluid with which the device 110 is in contact, a self-limiting oxide layer is formed on any exposed valve metal surfaces of the interconnect 151e. The barrier layer 155 could be a conformal coating (e.g., sprayed, spin-coated, or otherwise disposed onto the substrate 130 and other components of the device 110), a layer of material adhered via adhesive or other means, or some other coating or layer.

In some examples, such a barrier layer could be configured to impede and/or substantially prevent certain ions, present in the environment of the device 110, from interacting with a valve metal conductor of the device 110. For example, the valve metal conductor could include aluminum, and the barrier layer could be configured to impede and/or substantially prevent chloride ions, bromide ions, fluoride ions, iodide ions, or other halide ions from interacting with the conductor. This could include having a relatively low permeability to the ion(s). For example, the barrier layer could be composed of silicone (e.g., polydimethylsiloxane) or some other material that is permeable to water vapor but impermeable to chloride ions (or to some other halide ion or other substance of concern). Alternatively, the barrier layer could be impermeable to water and/or water vapor and also impermeable to chloride ions or other ions of concern (e.g., other halide ions). The barrier layer could have a thickness sufficient to impede and/or substantially prevent chloride or other halide ions from interacting with the underlying valve metal conductor (e.g., a thickness greater than 1.5 microns, or greater than 2 microns). In some embodiments, the barrier layer could be composed of parylene. Additionally or alternatively, the barrier layer could include a substance that getters chloride ions (or some other halide ion or other ion of concern). For example, such a barrier layer could include particles of hydrocalcite to getter chloride ions.

Additionally or alternatively, such a barrier layer could be configured to getter, absorb, and/or otherwise impede and/or substantially prevent other substances from interacting with a valve metal conductor, e.g., to prevent exposed valve metal surfaces of the conductor from growing non-self-limiting oxides. For example, the barrier layer could include substances to getter hydroxide ions in order to reduce the pH of fluid in contact with the valve metal conductor. Such hydroxide-absorbing and/or—gettering substances could include polyacrylic acid, polylactic acid, or some other polyacid(s). In order to reduce swelling of the barrier layer in response to such substances absorbing hydroxide ions, the polyacids could be provided as particles within some other polymeric substance and/or as copolymers with some other polymeric substance.

In the example shown in FIGS. 1A-D, the adjustable lens 121 and other elements of the electronic apparatus are fully encapsulated within the polymer layer 120; that is, the polymer layer 120 completely surrounds the adjustable lens 121, controller 150, conductive loop 170, and the interconnects 151a-f such that no aspect of those components is directly exposed to an environment of the eye-mountable device 110 (e.g., to a tear fluid of an eye to which the eye-mountable device 110 is mounted). However, this is intended as a non-limiting example embodiment. In other embodiments the electronic apparatus 111 may be fully encapsulated within such a polymer layer.

As shown in FIG. 1A, the controller 150 and sensor 160 are mounted to a side of the substrate 130 facing the convex surface 124. However, the electronics, sensor, interconnects, etc. situated on the substrate 130 can be mounted to either the "inward" facing side (e.g., situated closest to the concave surface 126) or the "outward" facing side (e.g., situated closest to the convex surface 124). Moreover, in some embodiments, some electronic components can be mounted on one side of the substrate 130, while other electronic components are mounted to the opposing side, and connections between the two can be made via conductive materials passing through the substrate 130.

The conductive loop 170 can be a layer of conductive material patterned along the flat surface of the substrate to form a flat conductive ring. In some instances, the conductive loop 170 can be formed without making a complete loop. For instance, the conductive loop 170 can have a cutout to allow room for the controller 150 and sensor 160, as illustrated in FIG. 1A. However, the conductive loop 170 can also be arranged as a continuous strip of conductive material that wraps entirely around the flat surface of the substrate 130 one or more times. For example, a strip of conductive material with multiple windings can be patterned on the side of the substrate 130 opposite the controller 150 and sensor 160. Interconnects between the ends of such a wound conductive loop can be passed through the substrate 130 to the controller 150.

Note that the eye-mountable device 110 illustrated in FIGS. 1A-D is intended as a non-limiting example embodiment. A device or system that includes valve metal conductors, batteries, controllers, or other elements as described herein could include additional or alternative elements to those shown in FIGS. 1A-D, or could lack some of the elements shown in FIGS. 1A-D. For example, such a system or device could be configured to be implanted within a body (e.g., within a lens chamber of an eye, within some other organ or tissue of a body), to be submerged within a stream or other fluid in a natural or artificial environment, to be mounted or otherwise operated within a mouth or gastrointestinal tract of a person, or to operate in some other environment according to an application.

The adjustable lens 121 is configured such that a voltage, current, or other property of an electrical signal applied to the adjustable lens 121 can be controlled to control the optical power of the electronically adjustable lens 121. In some examples, this could include applying a voltage across a layer of liquid crystal of the adjustable lens 121 to, e.g., control a refractive index of the liquid crystal. In other examples, the adjustable lens 121 could include an electrowetting lens, e.g., could include two or more immiscible fluids, which differ with respect to refractive index, disposed within a lens chamber. Controlling the optical power of such an adjustable lens 121 could include applying a voltage to one or more electrodes in contact with the immiscible fluids to control a geometry of an interface between the fluids. The adjustable lens 121 could include other components configured to provide a controllable optical power through some other method or process (e.g., by electronically controlling a flow of a fluid, by using magnetic fields to exert forces on magnetically active fluids, by using one or more piezo elements or other actuators to deform, translate, or rotate one or more lenses or other optical elements).

The adjustable lens 121 could include additional elements, e.g., electrodes to apply a voltage or current to a liquid crystal, to two or more immiscible fluids within a lens chamber of an electrowetting lens, and/or to some other element of the adjustable lens 121, one or more layers of material configured to contain and/or provide structure to other elements of the adjustable lens 121 (e.g., one or more rigid layers, formed as lenses, that contain a liquid crystal and that include a texture configure to align the liquid crystal relative to the rigid layers, a lens chamber containing two or more immiscible fluids), or other components. One or more electrodes of the adjustable lens 121 could be composed of a valve metal conductor and/or a layer of oxide as described herein. In some examples, the adjustable lens 121 could include one or more elements (e.g., one or more textured, rigid layers on which electrodes are disposed) composed of a rigid, gas permeable polymeric material, e.g., of the same material from which a rigid, gas permeable polymer layer encapsulating the electronic apparatus 111 is formed.

The adjustable lens 121 could include two or more lenses between which are disposed one or more volumes of liquid crystal. For example, the adjustable lens 121 could include stacked first, second, and third lenses, a first volume of liquid crystal disposed between the first and second lenses, and a second volume of liquid crystal disposed between the second and third lenses. Such an adjustable lens, including two separate volumes of liquid crystal, could be configured such that anisotropy in the optical effects of the liquid crystal is at least partially compensated for by providing the anisotropic optical effect in a first direction using the first volume of liquid crystal and also providing the anisotropic effect in a second, perpendicular direction using the second volume of liquid crystal. Two or more electrodes could also be provided (e.g., deposited or otherwise formed on one or more of the lenses) to apply an electrical field or other electrical force or energy to the volume(s) of liquid crystal of the adjustable lens 121 to control the optical power (e.g., the diopter, the focal length) of the adjustable lens 121.

The device 110 could include a variety of components (e.g., sensor 160) configured to detect one or more physical variables of interest, e.g., a light level, a bioelectric field, a spectrum of light received from vasculature of an eye. In some examples, the sensed variable could be related to one or more parameters of a body (e.g., an amount of blood in a portion of subsurface vasculature, an oxygenation state of blood, to what degree an eyelid is occluding the sensor), properties of the environment of the device (e.g., an ambient illumination, a barometric pressure, a temperature), properties of the device (e.g., an acceleration, an orientation), or to detect some other information. Such sensors could include accelerometers, electrodes (e.g., electrodes of an electrophysiological sensor configured to detect an electrooculogram, an electromyogram, or some other bioelectrical signal), light detectors, thermometers, gyroscopes, capacitance sensors, pressure sensors, strain gauges, light emitters, microphones, or other elements configured to detect one or more physical variables related to a property of interest. Variables detected using the sensor could be used to control an optical power of the adjustable lens 121. For example, the detected variables could be related to a vergence of an eye (e.g., relative to another eye), a distance between the eye-mountable device 110 and an object in an environment of a wearer, an electrical activity of the ciliary muscles or other muscles of an eye, a pupillary diameter, a degree of occlusion of the eye-mountable device 110, or some other variable(s) that could be used to determine, e.g., a desired optical power to provide to an eye of a wearer.

The eye-mountable device 110 may include an eyelid occlusion sensor configured to generate an output (e.g., a voltage, a current, a binary digital value) related to a degree of occlusion of the eyelid sensor and/or of the eye-mountable device 110 by one or more eyelids or other tissues of or proximate to an eye. Such an eyelid occlusion sensor could include one or both of the sensor 160 or conductive loop 170 or could include additional or alternative elements. For example, the eyelid occlusion sensor could include a light-sensitive element (e.g., a photodiode, a photoresistor) and could operate to generate an output related to a degree of occlusion of the light-sensitive element by using the light-sensitive element to detect an intensity or other property of light received by the light sensitive element. In some examples, the eye-mountable device 110 could include additional light-sensitive elements (e.g., disposed at respective locations around the substrate 130) and the eyelid occlusion sensor could use the additional light-sensitive elements to detect a degree of occlusion of the eye-mountable device 110, e.g., by detecting a sum or other property of the light detected by the additional light-sensitive elements, by determining how many of the additional light-sensitive elements are receiving more than a threshold amount of light, or by some other method.

In another example, the eyelid occlusion sensor could include the conductive loop 170 and could use the conductive loop to generate an output related to a degree of occlusion of the eye-mountable device 110. An impedance magnitude, real impedance, imaginary impedance, inductance, capacitance, resistance, quality-factor, resonance frequency, or some other property of the conductive loop 170 could be related to the degree of occlusion of the eye-mountable device 110 and the eyelid sensor could operate to detect such a property of the conductive loop 170. This could include applying a specified voltage and/or current waveform to the conductive loop 170 and detecting a property (e.g., a current, a voltage) of the response of the conductive loop 170 to the applied current and/or voltage.

III. Example Circuitry and Operations of a Device

As related elsewhere herein, the formation, maintenance, diminution, regrowth, and/or other processes related to the presence and properties of an oxide layer disposed on a surface of a valve metal conductor can be related to the voltage of that conductor relative to water or other fluids (e.g., tear fluid, interstitial fluid) that is in contact with the conductor. When the oxide layer is intact, it can prevent the flow of current between the conductor and the fluid. When the applied relative voltage is positive, the oxide layer may grow (due to oxidation of exposed, non-oxidized valve metal) until it attains a self-limiting thickness related to the magnitude of the applied voltage. When the applied relative voltage is negative, the oxide layer may be diminished (due to reduction of the oxide layer or other processes).

In order to maintain and/or grow an oxide layer on a valve metal conductor, a device or system that includes the conductor may be configured or operated to provide a positive voltage to the conductor, relative to a fluid in the environment of the system or device, during one or more periods of time. This could include a controller, a batter, or other components applying a non-negative voltage relative to the valve metal conductor relative to the fluid and/or to some element of the device that is in electrical contact with the fluid (e.g., an electrode). Additionally or alternatively, positive and negative voltages may be applied to the valve metal conductor, during respective different periods of time, in such a manner that the oxide layer on the conductor is maintained and/or such that additional amounts of the oxide layer may be grown over time (e.g., as a result of amount of the underlying valve metal being exposed by mechanical deformation or other damage.

As an illustrative embodiment, FIG. 3A illustrates an example system 300a that includes a controller 310a and an electrical component 320a. The electrical component 320a is electrically coupled to the controller 310a via first 331a and second 333a conductors. At least the first conductor 331a has an external surface that is composed of a valve metal (e.g., aluminum, tantalum, titanium, vanadium, tungsten, zirconium, niobium, hafnium, molybdenum, or alloys thereof) and that may be in contact with a fluid (e.g., tear fluid, aqueous humor, interstitial fluid) in an environment of the system 300a. The electrical component 320a could be an adjustable lens, a sensor, an antenna, an impedance sensor, an electrowetting pump or other microfluidic device, or some other component or system according to an application.

The first 331a and second 333a conductors are in electrical contact with a fluid in the environment of the system 300a (e.g., a tear fluid on an eye to which the system 300a is mounted, aqueous humor within a lens chamber of an eye in which the system 300a is implanted). This is represented in FIG. 3A by first 341a and second 343a effective impedances disposed between the first 331a and second 333a conductors, respectively, and a ground 301a which represents the fluid in the environment. The impedances 341a, 343a are related to the properties of the conductors 331a, 333a and of their contact with the environmental fluid. So, for example, a magnitude of the first impedance 341a could be related to a thickness of an oxide layer on the surface of the first conductor 331a, to a status of such an oxide layer as being intact or having damage (e.g., cracks, scratches, or other damage that exposes non-oxidized valve metal of the valve metal external surface of the conductor 331a), to a thickness or other properties of a protective layer (e.g., a silicone layer) disposed on the conductor(s) 331a, 333a, or to some other property of the valve metal surface of the conductor 331a and/or of an oxide layer formed or otherwise disposed thereon. The magnitude of the first impedance 341a could be increased if an oxide layer is grown on the valve metal external surface and/or if such an oxide layer increases in thickness. Conversely, the magnitude of the first impedance 341a could decrease if such an oxide layer is damaged, exposing the underlying valve metal of the first conductor 341a.

In order to grow, regrow, repair, or otherwise maintain such an oxide layer on the valve metal external surface of the first conductor 331a, a positive voltage could be applied to the first conductor 331a relative to the environmental fluid 301a. This could be accomplished by applying a positive voltage to the first conductor 331a relative to the second conductor 333a. However, applying such a voltage between the conductors 331a, 333a could result in a reducing potential and/or a reducing current being present at a surface of the second conductor 333a that is in contact with the environmental fluid 301a. Such a current could be present if the application of the voltage results in the growth of additional valve metal oxide on the first conductor 331a (e.g., due to oxidation of an amount of exposed valve metal of the first conductor 331a).

In order to prevent damage (e.g., reduction in the thickness of a valve metal oxide layer present on a valve metal external surface of the second conductor 333a) from accruing to the second conductor 333a as a result of this applied voltage, the controller 310a could apply, during a subsequent period of time, a positive voltage to the second conductor 333a relative to the first conductor 331a.

Additionally or alternatively, the second conductor could be composed of and/or coated with a noble metal (e.g., gold, platinum). Electrical contact between such a second conductor and the environmental fluid 301a could be facilitated by exposing the second conductor 333a to the environmental fluid (e.g., via a window formed through a protective coating or conformal layer of the system 300a that encapsulates and protects elements of the system 300a). A surface area of the second conductor 333a that is in contact with the environmental fluid 301a could be increased (e.g., to reduce a current density at the surface).

In some examples, a system or device as described herein could include an electrode configured to provide electrical contact with environmental fluid(s) in order to facilitate the growth and maintenance of protective, self-limiting valve metal oxide layers on valve metal conductors as described herein. As an illustrative embodiment, FIG. 3B illustrates an example system 300*b* that includes a controller 310*b* and an electrical component 320*b*. The electrical component 320*b* is electrically coupled to the controller 310*b* via first 331*b* and second 333*b* conductors. The system 300*b* additionally includes an electrode 350*b* that is exposed to fluid in the environment of the system 300*b* (e.g., a tear fluid on an eye to which the system 300*b* is mounted, aqueous humor within a lens chamber of an eye in which the system 300*b* is implanted).

The first 331*b* and second 333*b* conductors are also in electrical contact with fluid in the environment of the system 300*b*). This is represented in FIG. 3B by first 341*b*, second 343*b*, and third 345*b* effective impedances disposed between the first 331*b* conductor, the second conductor 333*b*, and the electrode 350*b*, respectively, and a ground 301*b* which represents the fluid in the environment. In order to apply a positive voltage to either of the conductors 331*b*, 333*b* relative to the environmental fluid, the controller 310*b* could apply positive voltages to the conductors 331*b*, 333*b* relative to the electrode 350*b*. Thus, the controller 310*b* could apply relative voltages between the first 331*a* and second 333*b* conductors that may alternate between positive and negative voltages while maintaining positive relative voltages between the conductors 331*b*, 333*b* and the environmental fluid.

IV. Example Electronics of a Device

Figure 4:
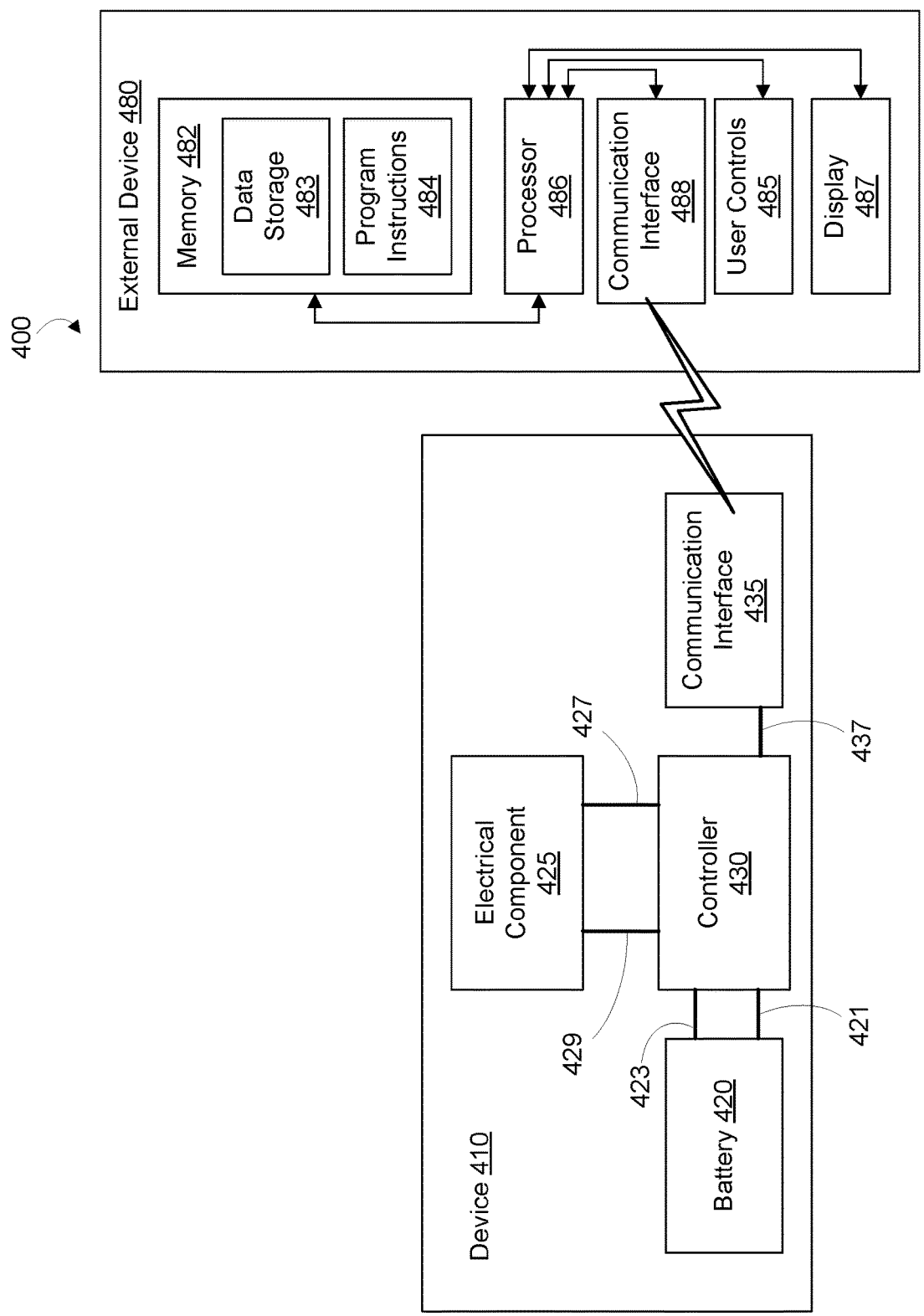
FIG. 4 is a block diagram of an example system that includes a device that can be immersed in a body fluid and that is in wireless communication with an external reader.

FIG. 4 is a block diagram of a system 400 that includes a device 410 (e.g., an eye-mountable device) as described herein. The device 410 is in wireless communication with an external device 480. The device 410 includes a controller 430, an electrical component 425, a battery 420, and a communication interface 435. The electrical component 425 could be an adjustable lens, a sensor, an antenna, an impedance sensor, an electrowetting pump or other microfluidic device, or some other component or system according to an application. The battery 420 is configured to provide power to the controller. The communication interface 435 includes one or more antennas, amplifiers, oscillators, mixers, modulators, or other elements that can be operated by the controller 430 to wirelessly communicate information between the device 410 and the external device 480 via radio frequency signals or some other wireless signals.

The communication interface 435, the controller 430, the electrical component 425, and the battery 420 can all be connected together via conductors 421, 423, 427, 429, 437, e.g., via patterned conductive traces formed on a substrate material on which the components (e.g., 420, 425, 430, 435) are disposed. Further, impedance sensing electrodes, electrowetting lens electrodes, liquid crystal lens electrodes, conductive loops, antennas, or other elements of the components (e.g., 420, 425, 430, 435) could comprise conductive traces or patterns formed on such a substrate material.

Such conductors or other conductive materials of the device 410 could include valve metals on one or more external surfaces, as described herein. For example, one or both of the conductors 427, 428 that electrically couple the electrical component 425 to the controller 430 could have an external surface composed of a valve metal and/or could include a layer of valve metal oxide disposed thereon. In another example, one or both of the first 421 and second 423 conductors that electrically couple the battery 420 to the controller 430 could have an external surface composed of a valve metal and/or could include a layer of valve metal oxide disposed thereon. For example, the first conductor 421 could couple the positive terminal of the battery 420 to the controller 430 and could have a valve metal external surface. Thus, the battery 420 may apply a positive voltage to the first conductor 421 relative to the second conductor 423 such that a protective, self-limiting oxide layer may be maintained on the surface of the first conductor 421 as described elsewhere herein.

The controller 430 could include a variety of electronic components to facilitate operations of the device 410 as described elsewhere herein. For example, the controller could include amplifiers, comparators, sample-and-hold circuitry, analog-to-digital converter(s), voltage references, constant current sources, pulse generators, oscillators, rectifiers, or other circuitry to operate a sensor of the electrical component 425 to generate an output related to a signal of interest (e.g., to a degree of occlusion of the sensor and/or the device 410 by an eyelid of an eye to which the device 410 is mounted). The controller 430 could include amplifiers, charge pumps, boost converters, constant current sources, voltage references, switches, blocking capacitors, rectifiers, digital-to-analog converters, or other circuitry to operate an adjustable lens of the electrical component 425 to provide a specified optical power, e.g., to provide an optical power selected from a set of two or more different optical powers. Such different optical powers could facilitate a wearer viewing objects within respective different ranges of distances from the viewer's eye when the device 410 is mounted to the viewer's eye.

The controller 430 could additionally include logic components configured to implement the methods of operation of a device described herein. In some examples, such logic components could include one or more digital counters, clocks, latches, flip-flops, comparators, lookup tables, multipliers, adders, coincidence detectors, registers, or other components configured to provide a finite state machine or other form of digital controller configured to implement the operations described herein. Additionally or alternatively, the controller 430 could include a computing device that includes one or more processors configured to execute program instructions stored in a memory of the device in order to perform the operations described herein. For example, the controller could include a flash memory, a programmable read-only memory, or some other non-volatile computer readable medium that could contain such program instructions. In some examples, the controller 430 could be configured and/or programmed to receive such instructions (e.g., from the external device 480) using the communication interface (e.g., to receive initial programming for the device 410, to receive programming updates, to receive user preferences or parameters).

Note that a device as described herein could include additional, fewer, and/or or alternative components to those shown in FIG. 4 (e.g., additional electrical components, conductors, batteries, controllers, transmitters, receivers, etc.). For example, the device 410 could lack the communication interface 435 and could be configured to operate independent of any external devices (e.g., 480) to operate the electrical component 425 and/or to apply voltages to the conductors 421, 423, 427, 429 as described herein.

The external device 480 includes a communication interface 488 to send and receive wireless signals to and from the device 410. The external device 480 also includes a computing system with a processor 486 in communication with a memory 482. The external device 480 can also include one or more of user controls 485, and a display 487. The memory 482 is a non-transitory computer-readable medium that can include, without limitation, magnetic disks, optical disks, organic memory, and/or any other volatile (e.g. RAM) or non-volatile (e.g. ROM) storage system readable by the processor 486. The memory 482 can include a data storage 483 to store indications of data, such as user preferences (e.g., a user selection between a number of different potential user interface schemes that could be implemented by the device 410), program settings (e.g., to adjust behavior of the device 410 and/or external device 480), etc. The memory 482 can also include program instructions 484 for execution by the processor 486 to cause the external device 480 to perform processes specified by the instructions 484. For example, the program instructions 484 can cause external device 480 to perform any of the function described herein. For example, program instructions 484 may cause the external device 480 to provide a user interface that allows for retrieving information communicated from the device 410 (e.g., sensor outputs or other information related to an environment of the device 410, e.g., to an eye of a wearer of the device 410) by displaying that information on the display 487 in response to commands input through the user controls 485.

The external device 480 can be a smart phone, digital assistant, or other portable computing device with radios, light emitters, light detectors, or other wireless connectivity sufficient to provide for wireless communication with the communication interface 435 of the device 410. The external device 480 can also be implemented as an wireless module (e.g., a radio, an optical data link) that can be plugged into a portable computing device, such as in an example where radio frequency wireless signals used to communicate with the device 410 are at carrier frequencies not commonly employed in portable computing devices. In some instances, the external device 480 is a special-purpose device configured to be disposed relatively near a mounting location of the device 410 on a wearer's body (e.g., near a wearer's eye) to allow the communication interfaces 435, 488 to operate with a low power budget. The external device 480 could also be implemented in eye glasses or a head-mounted display.

V. Conclusion

Where example embodiments involve information related to a person or a device of a person, the embodiments should be understood to include privacy controls. Such privacy controls include, at least, anonymization of device identifiers, transparency and user controls, including functionality that would enable users to modify or delete information relating to the user's use of a product.

Further, in situations in where embodiments discussed herein collect personal information about users, or may make use of personal information, the users may be provided with an opportunity to control whether programs or features collect user information (e.g., information about a user's medical history, social network, social actions or activities, profession, a user's preferences, or a user's current location), or to control whether and/or how to receive content from the content server that may be more relevant to the user. In addition, certain data may be treated in one or more ways before it is stored or used, so that personally identifiable information is removed. For example, a user's identity may be treated so that no personally identifiable information can be determined for the user, or a user's geographic location may be generalized where location information is obtained (such as to a city, ZIP code, or state level), so that a particular location of a user cannot be determined. Thus, the user may have control over how information is collected about the user and used by a content server.

The particular arrangements shown in the Figures should not be viewed as limiting. It should be understood that other embodiments may include more or less of each element shown in a given Figure. Further, some of the illustrated elements may be combined or omitted. Yet further, an exemplary embodiment may include elements that are not illustrated in the Figures.

Additionally, while various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are contemplated herein.

What is claimed is:

1. A device that is immersible in a body fluid, the device comprising:
   a first conductor, wherein a surface of the first conductor comprises a valve metal;
   a second conductor;
   an electrical component that is electrically coupled to the first conductor and the second conductor, wherein the electrical component comprises a sensor, and wherein the sensor comprises a first electrode and a second electrode; and
   a controller, wherein the controller is electrically coupled to the electrical component via the first conductor and the second conductor, wherein the controller is electrically coupled to the first electrode via the first conductor, wherein the controller is electrically coupled to the second electrode via the second conductor, and wherein the controller is operable to apply a voltage between the first conductor and the second conductor such that the first conductor has a positive voltage relative to the second conductor.

2. The device of claim 1, further comprising a polymeric material, wherein the first conductor, second conductor, electrical component, and controller are at least partially embedded within the polymeric material, wherein the polymeric material is permeable to water, and wherein the polymeric material is shaped to be mounted on an external surface of an eye.

3. The device of claim 1, wherein the electrical component comprises an adjustable lens, wherein an optical power of the adjustable lens is related to a magnitude of at least one of a voltage or a current applied to the adjustable lens by the controller via the first conductor and the second conductor.

4. The device of claim 1, wherein the valve metal comprises at least one of aluminum, tungsten, titanium, vanadium, zirconium, niobium, hafnium, molybdenum, or tantalum.

5. The device of claim 1, wherein the device further comprises:
   a barrier layer, wherein the first conductor is enclosed within the barrier layer such that the barrier layer impedes negative ions from an environment of the device from interacting with the first conductor.

6. The device of claim 5, wherein the barrier layer impedes chloride ions from an environment of the device from interacting with the first conductor.

7. The device of claim 6, wherein the barrier layer comprises a layer of parylene.

8. The device of claim 7, wherein the layer of parylene has a thickness greater than 1.5 microns.

9. The device of claim 5, wherein the barrier layer comprises a substance that getters chloride ions.

10. The device of claim 5, wherein the barrier layer comprises a substance that getters hydroxide ions.

11. The device of claim 1, wherein the surface of the first conductor further comprises an oxide layer, wherein the oxide layer comprises an amount of the valve metal that is oxidized.

12. The device of claim 1, wherein a surface of the second conductor comprises a noble metal.

13. A device that is immersible in a body fluid, the device comprising:
   a first conductor, wherein a surface of the first conductor comprises a valve metal;
   a second conductor, wherein a surface of the second conductor comprises a valve metal;
   an electrical component that is electrically coupled to the first conductor and the second conductor; and
   a controller, wherein the controller is electrically coupled to the electrical component via the first conductor and the second conductor, and wherein the controller is operable to:
      apply, during a first period of time, a voltage between the first conductor and the second conductor such that the first conductor has a positive voltage relative to the second conductor; and
      apply, during a second period of time, a voltage between the first conductor and the second conductor such that the first conductor has a negative voltage relative to the second conductor.

14. The device of claim 13, further comprising a polymeric material, wherein the first conductor, second conductor, electrical component, and controller are at least partially embedded within the polymeric material, wherein the polymeric material is permeable to water, and wherein the polymeric material is shaped to be mounted on an external surface of an eye.

15. The device of claim 13, wherein the electrical component comprises an adjustable lens, wherein an optical power of the adjustable lens is related to a magnitude of at least one of a voltage or a current applied to the adjustable lens by the controller via the first conductor and the second conductor.

16. The device of claim 13, wherein the electrical component comprises a sensor, wherein the sensor comprises a first electrode and a second electrode, wherein the controller is electrically coupled to the first electrode via the first conductor, and wherein the controller is electrically coupled to the second electrode via the second conductor.

17. The device of claim 13, wherein the valve metal comprises titanium.

18. The device of claim 17, wherein the surface of the first conductor further comprises an oxide layer, wherein the oxide layer comprises titanium oxide.

19. The device of claim 13, wherein the device further comprises:
   a barrier layer, wherein the first conductor and second conductor are enclosed within the barrier layer such that the barrier layer impedes negative ions from an environment of the device from interacting with the first conductor and second conductor.

20. The device of claim 13, wherein the device further comprises:
   a barrier layer, wherein the first conductor and second conductor are enclosed within the barrier layer such that the barrier layer impedes negative ions from an environment of the device from interacting with the first conductor and second conductor, and wherein the barrier layer comprises a substance that getters chloride ions.

* * * * *